(12) United States Patent
Liu et al.

(10) Patent No.: US 7,863,694 B2
(45) Date of Patent: Jan. 4, 2011

(54) ORGANIC THIN FILM TRANSISTORS

(75) Inventors: Ping Liu, Mississauga (CA); Yiliang Wu, Mississauga (CA); Yuning Li, Singapore (CN); Paul F. Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 163 days.

(21) Appl. No.: 12/250,710

(22) Filed: Oct. 14, 2008

(65) Prior Publication Data

US 2010/0090201 A1 Apr. 15, 2010

(51) Int. Cl.
*H01L 51/00* (2006.01)
*H01L 21/02* (2006.01)

(52) U.S. Cl. ............ 257/410; 257/40; 257/347; 257/411; 257/E51.007; 257/E21.625; 438/216; 438/287

(58) Field of Classification Search ............. 438/153, 438/154, 216, 287, 99; 257/40, 368, 410, 257/411, 347, E51.005, E51.006, E51.007, 257/E21.639, E21.625
See application file for complete search history.

(56) References Cited

U.S. PATENT DOCUMENTS

2006/0011909 A1* 1/2006 Kelley et al. ............. 257/40
2006/0214154 A1 9/2006 Yang et al.

* cited by examiner

*Primary Examiner*—Julio J Maldonado
(74) *Attorney, Agent, or Firm*—Fay Sharpe LLP

(57) ABSTRACT

A thin film transistor having an improved gate dielectric layer is disclosed. The gate dielectric layer comprises a poly(hydroxyalkyl acrylate-co-acrylonitrile) based polymer. The resulting gate dielectric layer has a high dielectric constant and can be crosslinked. Higher gate dielectric layer thicknesses can be used to prevent current leakage while still having a large capacitance for low operating voltages. Methods for producing such gate dielectric layers and/or thin film transistors comprising the same are also disclosed.

16 Claims, 2 Drawing Sheets

ORGANIC THIN FILM TRANSISTORS

BACKGROUND

The present disclosure relates, in various embodiments, to thin-film transistors (TFTs) and/or other electronic devices comprising a semiconducting layer and a gate dielectric layer. The gate dielectric layer comprises a poly(hydroxyalkyl acrylate-co-acrylonitrile) (PHAAN) based polymer. The resulting dielectric layer has a high dielectric constant and can be crosslinked. Certain gate dielectric layer thicknesses can therefore still prevent current leakage while having a large capacitance, enabling low operating voltages.

TFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio. High mobility and high on/off ratio are desired.

There is interest in organic thin film transistors (OTFTs) for applications such as radio frequency identification (RFID) tags and backplane switching circuits for displays, such as signage, readers, and liquid crystal displays, where high switching speeds and/or high density are not essential. OTFTs may be made using low-cost solution or liquid fabrication techniques. They also have attractive mechanical properties such as being physically compact, lightweight, and flexible.

Recently, there has been an increased interest in organic thin film transistors which can potentially be fabricated using solution-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin film transistor circuits for electronic devices. To enable the use of these solution-based processes in fabricating thin film transistor circuits, solution processable materials are therefore required.

In this regard, gate dielectric layers may be formed by these solution-based processes. However, the gate dielectric layer so formed should be free of pinholes and possess low surface roughness (or high surface smoothness), low leakage current, a high dielectric constant, a high breakdown voltage, adhere well to the gate electrode, be stable in solution at room temperature, and offer other functionality. It should also be compatible with semiconductor materials because the interface between the dielectric layer and the organic semiconductor layer critically affects the performance of the TFT.

Most solution processable polymers used in gate dielectric layers usually have low dielectric constants and do not contain crosslinkable functional groups, so a considerable dielectric thickness is required to reduce gate leakage current to an acceptable level. As a result, the capacitance of the dielectric layer is usually low, leading to high operating voltage and low mobility. Therefore, there is a need of solution processable polymers with high dielectric constant, crosslinkable functional groups, as well as gate dielectric layers formed by such polymers having a certain thickness, high dielectric constant, and high capacitance.

BRIEF DESCRIPTION

The present application discloses, in various exemplary embodiments, dielectric layers and thin film transistors, particularly organic thin film transistors (OTFTs), formed with such layers. The dielectric layers comprise a poly(hydroxyalkyl acrylate-co-acrylonitrile) based polymer, such as a poly(2-hydroxyethyl acrylate-co-methacrylonitrile)copolymer.

Disclosed in embodiments are thin film transistors comprising a substrate, a gate dielectric layer, and a semiconducting layer, wherein the gate dielectric layer comprises a poly(hydroxyalkyl acrylate-co-acrylonitrile) based polymer of Formula (I):

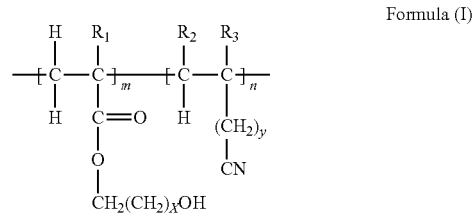

Formula (I)

wherein $R_1$, $R_2$, and $R_3$ are independently selected from alkyl, cyanoalkyl, cyano, and hydrogen; x is from 1 to 5; y is from 0 to 5; m is the number of hydroxyalkyl acrylate monomers, and n is the number of acrylonitrile monomers.

The poly(hydroxyalkyl acrylate-co-acrylonitrile) based polymer may have a dielectric constant of from about 3 to about 18, including from about 4 to about 10.

The poly(hydroxyalkyl acrylate-co-acrylonitrile) based polymer may also be crosslinked with a crosslinking agent, such as one selected from the group consisting of isocyanates, tri(2-aminoethyl)amine, diethylene triamine, melamine-formaldehyde resins, compounds containing at least two epoxy groups, compounds containing at least two carboxylic acid groups, and acid anhydrides of carboxylic acid, and mixtures thereof.

The molar ratio of hydroxyalkyl acrylate to acrylonitrile in the poly(hydroxyalkyl acrylate-co-acrylonitrile) based polymer may be from about 9:1 to about 1:9, including from about 2:1 to about 1:2.

In particular embodiments, the poly(hydroxyalkyl acrylate-co-acrylonitrile) based polymer is a poly(hydroxyalkyl acrylate-co-acrylonitrile) copolymer, such as poly(2-hydroxyethyl acrylate-co-methacrylonitrile).

The gate dielectric layer may further comprise inorganic nanoparticles. The gate dielectric layer may have a thickness of 2 microns or less.

The semiconducting layer comprises a thiophene-based polymer, particularly one having the structure of formula (1):

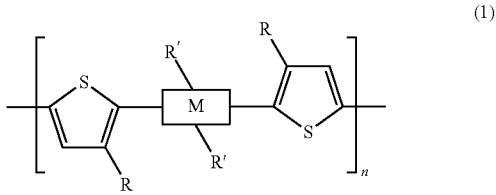

(1)

where R and R' are independently selected from hydrogen, halogen, alkyl, alkoxyalkyl, siloxyalkyl, and perfluoroalkyl; M is a divalent linkage; and n is the number of repeat units.

The gate dielectric layer may have a capacitance greater than 10 nF/cm². In some embodiments, the gate dielectric layer has a thickness of from about 100 nanometers to about 1000 nanometers, and a capacitance greater than 10 nF/cm².

In other embodiments is disclosed a gate dielectric layer for an electronic device, the layer comprising a poly(hydroxyalkyl acrylate-co-acrylonitrile) based polymer.

Also disclosed are methods for preparing a thin-film transistor, comprising:
    providing a substrate;
    placing a gate electrode upon the substrate;
    placing a gate dielectric layer upon the substrate;
    placing a source electrode upon the substrate;
    placing a drain electrode upon the substrate; and
    placing a semiconducting layer upon the substrate;
    wherein the gate dielectric layer comprises a poly(hydroxyalkyl acrylate-co-acrylonitrile) based polymer; and
    wherein the gate dielectric layer is placed so to separate the gate electrode from the semiconducting layer, the source electrode, and the drain electrode.

The poly(hydroxyalkyl acrylate-co-acrylonitrile) based polymer can be applied by a solution deposition method selected from the group consisting of blanket coating, spin coating, blade coating, rod coating, dip coating, printing, screen printing, ink jet printing, stamping, stencil printing, screen printing, gravure printing, and flexography printing.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
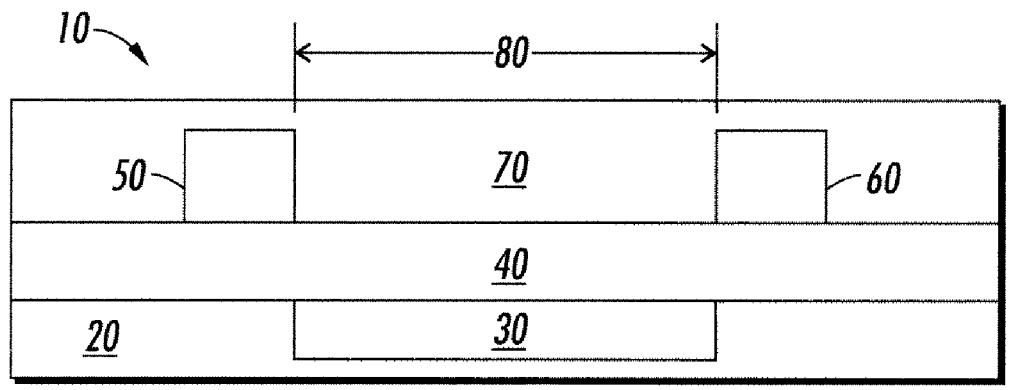
FIG. 1 represents a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

FIG. 1 illustrates a bottom-gate bottom-contact TFT configuration according to the present disclosure. The TFT 10 comprises a substrate 20 in contact with the gate electrode 30 and a gate dielectric layer 40. Although here the gate electrode 30 is depicted within the substrate 20, this is not required. However, it is important that the gate dielectric layer 40 separates the gate electrode 30 from the source electrode 50, drain electrode 60, and the semiconducting layer 70. The semiconducting layer 70 runs over and between the source and drain electrodes 50 and 60. The semiconductor has a channel length 80 between the source and drain electrodes 50 and 60.

Figure 2:
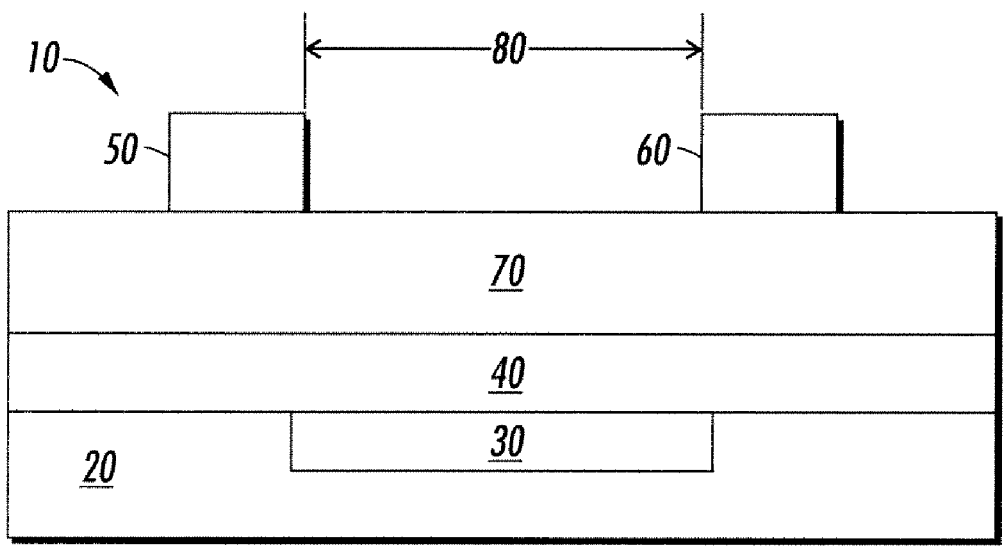
FIG. 2 represents a second embodiment of a TFT according to the present disclosure.

FIG. 2 illustrates another bottom-gate top-contact TFT configuration according to the present disclosure. The TFT 10 comprises a substrate 20 in contact with the gate electrode 30 and a gate dielectric layer 40. The semiconducting layer 70 is placed on top of the gate dielectric layer 40 and separates it from the source and drain electrodes 50 and 60.

Figure 3:
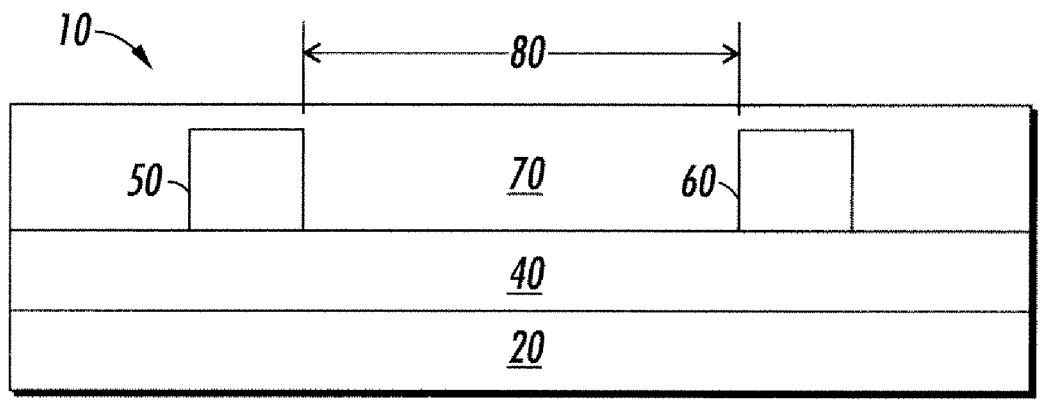
FIG. 3 represents a third embodiment of a TFT according to the present disclosure.

FIG. 3 illustrates a bottom-gate bottom-contact TFT configuration according to the present disclosure. The TFT 10 comprises a substrate 20 which also acts as the gate electrode and is in contact with a gate dielectric layer 40. The source electrode 50, drain electrode 60, and semiconducting layer 70 are located atop the gate dielectric layer 50.

Figure 4:
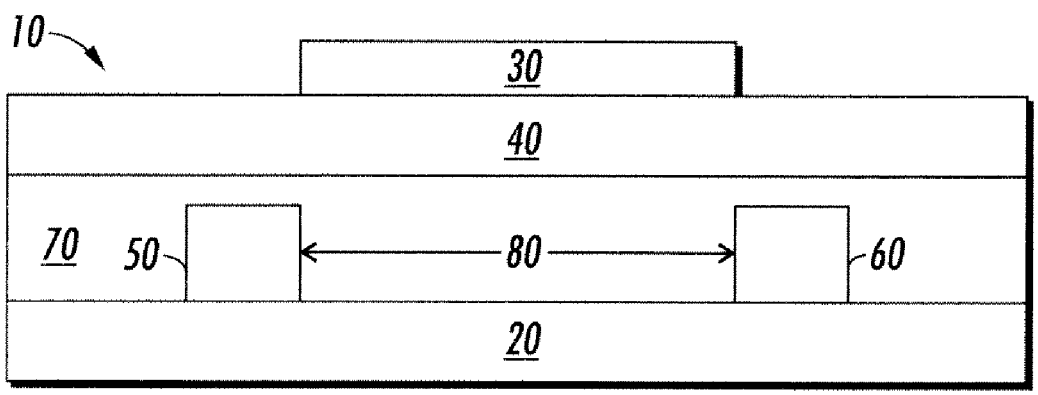
FIG. 4 represents a fourth embodiment of a TFT according to the present disclosure.

FIG. 4 illustrates a top-gate top-contact TFT configuration according to the present disclosure. The TFT 10 comprises a substrate 20 in contact with the source electrode 50, drain electrode 60, and the semiconducting layer 70. The semiconducting layer 70 runs over and between the source and drain electrodes 50 and 60. The gate dielectric layer 40 is on top of the semiconducting layer 70. The gate electrode 30 is on top of the gate dielectric layer 40 and does not contact the semiconducting layer 70.

The gate dielectric layer of the present disclosure comprises a poly(hydroxyalkyl acrylate-co-acrylonitrile) ("PHAAN") based polymer. The PHAAN based polymer contains repeating units derived from at least two monomers, hydroxyalkyl acrylate and acrylonitrile, as shown in Formula (I):

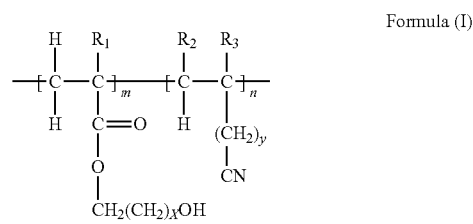

Formula (I)

wherein $R_1$, $R_2$, and $R_3$ are independently selected from alkyl, cyanoalkyl, cyano, and hydrogen; x is from 1 to 5; y is from 0 to 5; m is the number of hydroxyalkyl acrylate monomers, and n is the number of acrylonitrile monomers, respectively, present in the PHAAN based polymer. m and n each can be independently from about 10 to about 10,000. In some specific embodiments, x is 2 or y is 0. In other specific embodiments, $R_1$, $R_2$, and $R_3$ are independently selected from methyl and hydrogen. In particular embodiments, the PHAAN based polymer is a copolymer, i.e. containing only two monomers. In specific embodiments, the PHAAN based polymer is poly(2-hydroxyethyl acrylate-co-methacrylonitrile).

Because both of the monomers are polar, the dielectric constant of the resulting polymer can be very high. The dielectric layer comprising the PHAAN based polymer may have a dielectric constant of from about 3 to about 18. The dielectric constant can be adjusted by controlling the ratio between the two monomers. Generally, the higher the amount of acrylonitrile, the higher the dielectric constant. In further embodiments, the PHAAN based polymer has a dielectric constant of from about 4 to about 10. In other embodiments, the molar ratio of hydroxyalkyl acrylate to acrylonitrile in the PHAAN based polymer is from about 9:1 to about 1:9, or from about 2:1 to about 1:2.

The hydroxy functional group allows the PHAAN based polymer to be crosslinked, photochemically or using crosslinking agents, in the gate dielectric layer. For example, the PHAAN based polymer can be photochemically crosslinked under UV irradiation or chemically crosslinked with any suitable crosslinking agent. Exemplary crosslinking agents include melamine-formaldehyde resins (MF-resins), isocyanates, tri(2-aminoethyl)amine, diethylene triamine, formaldehyde-based resins, compounds containing at least two epoxy groups, compounds containing at least two carboxylic acid groups, acid anhydrides of carboxylic acid, and mixtures thereof. In specific embodiments, the gate dielectric layer is crosslinked with MF-resins.

The total thickness of the gate dielectric layer may be, for example, from about 5 nanometers to about 5 microns, including from about 100 nanometers to about 1 micron. In particular embodiments, the gate dielectric layer has a thickness of 2 microns or less, including from about 100 to about 1000 nanometers. Unlike other solution processable polymeric gate dielectric materials, the poly(hydroxyalkyl acrylate-co-acrylonitrile) based polymer does not require a very thin layer in order to achieve low operating voltage. The thicker gate dielectric layer still has good capacitance, low operating voltage, and high charge carrier mobility. The gate dielectric layer may have a conductivity that is, for example, less than about $10^{-12}$ Siemens per centimeter (S/cm). When deposited as a film, the dielectric layer will have a large capacitance even with a relatively high thickness. Large capacitance enables low operating voltage, while high thickness warrants low gate leakage. In embodiments, the dielectric layer has a capacitance greater than 10 nF/cm$^2$, preferably greater than 20 nF/cm$^2$.

In further embodiments, the gate dielectric layer further comprises inorganic particles such as nanoparticles. The nanoparticles have a particle size of from about 3 nm to about 500 nm, or from about 3 nm to about 100 nm. Any suitable inorganic nanoparticles can be used. Exemplary nanoparticles include metal nanoparticles such as Au, Ag, Cu, Cr, Ni, Pt and Pd; metal oxide nanoparticles such as $Al_2O_3$, $TiO_2$, $ZrO_2$, $La_2O_3$, $Y_2O_3$, $Ta_2O_5$, $ZrSiO_4$, SrO, SiO, $SiO_2$, MgO, CaO, $HfSiO_4$, $BaTiO_3$, $HFO_2$; and other inorganic nanoparticles such as ZnS and $Si_3N_4$. The addition of inorganic nanoparticles has several advantages. First, the dielectric constant of the overall gate dielectric layer can be increased. Second, when metal nanoparticles are added, the particles can function as electron traps to lower gate leakage of the gate dielectric layer. The inorganic nanoparticles can be from about 0.1% to about 50% or from about 1% to about 20% by weight of the gate dielectric layer.

When a poly(hydroxyalkyl acrylate-co-acrylonitrile) copolymer is used, it may be synthesized by free radical polymerization as shown in Scheme (1):

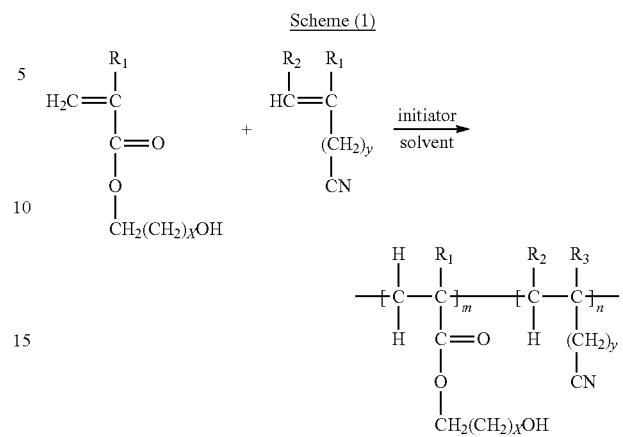

Generally, the hydroxyalkyl acrylate and acrylonitrile monomers are mixed with an initiator to form a polymer. Suitable initiators and solvents are known.

The gate dielectric layer is formed using conventional processes known in the art. In embodiments, the gate dielectric layer is formed using liquid depositing techniques. Any suitable liquid depositing technique may be employed. Exemplary liquid depositing techniques include blanket coating such as spin coating, blade coating, rod coating, dip coating, and the like, and printing such as screen printing, ink jet printing, stamping, stencil printing, screen printing, gravure printing, flexography printing, and the like.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

The semiconducting layer of the present disclosure comprises an organic semiconductor. Regarding electrical performance characteristics, the organic semiconductor usually has conductivity in the range of $10^{-8}$ to $10^{-4}$ S/cm, preferably from $10^{-7}$ to $10^{-5}$ S/cm. Various dopants known in the art may also be added to change the conductivity. The organic semiconductor can be either a p-type or n-type semiconductor. Examples of organic semiconductors include but are not limited to acenes, such as anthracene, tetracene, pentacene, and substituted pentacenes, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines or zinc phthalocyanines and their substituted derivatives.

In specific embodiments, the organic semiconductors are polythiophenes. Polythiophenes include, for example, regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene groups, polythiophenes comprising fused-ring aromatic groups, polythiophenes comprising heteroatom-containing fused-ring aromatic groups, and polythiophenes comprising non-thiophene based aromatic groups such as phenylene, fluorene, furan, and the like.

In specific embodiments, the polythiophene semiconductor has the following general structure:

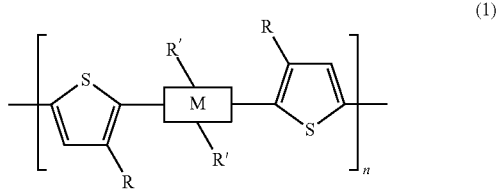

(1)

where R and R' are independently selected from hydrogen, halogen, alkyl, alkoxyalkyl, siloxyalkyl, and perfluoroalkyl; M is a divalent linkage; and n is the number of repeat units. In specific embodiments, M is thienylene, substituted thienylene, bithiophene, terthiophene, arylene, substituted arylene, heteroarylene, or substituted heteroarylene. In more specific embodiments, M is phenylene, thienothiophene, benzothiophene, carbazole, indolocarbazole, fluorene, benzodithiophene, or bithiophene. In other specific embodiments, R and R' are selected from alkyl. In more specific embodiments, R and R' are alkyl containing from about 1 to about 25 carbon atoms, including from about 4 to about 18 carbon atoms, and further including from about 6 to about 16 carbon atoms, including isomeric forms thereof, mixtures thereof, and the like.

The semiconducting layer is from about 5 nanometers to about 1000 nanometers deep, including from about 20 to about 100 nanometers in depth. In certain configurations, such as the configurations shown in FIGS. 1 and 4, the semiconducting layer completely covers the source and drain electrodes.

The semiconducting layer can be formed by molecular beam deposition, vacuum evaporation, sublimation, spin-on coating, dip coating, printing (e.g., inkjet printing, screen printing, stencil printing, microcontact printing, flexographic printing), and other conventional processes known in the art, including those processes described in forming the gate electrode.

The various components of the OTFT may be deposited upon the substrate in any order. The term "upon the substrate" should not be construed as requiring that each component directly contact the substrate. The term should be construed as describing the location of a component relative to the substrate. Generally, however, the gate electrode and the semiconducting layer should both be in contact with the gate dielectric layer. In addition, the source and drain electrodes should both be in contact with the semiconducting layer.

The resulting TFT has good mobility and good current on/off ratio. In embodiments, the TFT may have a charge carrier mobility of 0.01 cm$^2$/V·sec or greater. In other embodiments, the TFT has a current on/off ratio of from about $10^4$ or more.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Synthesis of Copolymer:
Poly(2-hydroxyethyl methacrylate-co-methacrylonitrile) ($R_1$=methyl, $R_2$=H, $R_3$=methyl) was made.
A solution was made containing 2-hydroxyethyl methacrylate (3.00 grams, 23.1 mmol), methacrylonitrile (1.55 grams, 23.1 mmol), and 100 ml of THF, which was then flushed with argon atmosphere. An initiator, azobisisobutyronitrile (AIBN) (0.076 grams, 0.461 mmol), was then added. The reaction mixture was heated to 75° C. and refluxed for 24 hours. The mixture was cooled to room temperature and then precipitated in hexane. After removing solvent, the product, poly(2-hydroxyethyl methacrylate-co-methacrylonitrile), was obtained.
Mw: 8294; Mn 4814; Elemental analysis: O (wt %), 26.72; N (wt %), 5.76. The composition of two monomer units in the copolymer (mole %) calculated from the elemental analysis was shown in the following: 2-hydroxyethyl methacrylate/methacrylonitrile: 53.7/46.3 (mol %).

Fabrication of Capacitor and Transistors:
0.1 grams of the above copolymer and 0.05 grams of poly (melamine-co-formaldehyde), 84 wt % in 1-butanol (MF-resin) were dissolved in 1 gram DMF. After filtration with a 0.2 micrometer PTFE syringe filter, the solution was spin coated onto an aluminum coated PET substrate at 2000 rpm. The aluminum layer functioned as an electrode for the capacitor and transistors. After being dried at 80° C. for about 5-10 minutes, the dielectric layer was crosslinked at 150° C. on a hot plate for about 30 minutes, resulting in a robust layer with a thickness of 380 nm. Gold electrodes were vacuum evaporated on top of the gate dielectric layer to form capacitors. The capacitance was detected to be 11.4 nF/cm$^2$ and the dielectric constant was calculated to be 4.9.

The above dielectric layer was then modified with a poly (methyl silsesquioxane) (PMSSQ) interfacial layer as follows. The dielectric layer was first plasma cleaned for 30 seconds, followed by washing with water and isopropanol. A dilute solution of PMSSQ in n-butanol was spin coated on top of the gate dielectric layer at 2000 rpm. After being dried at 80° C., the PMSSQ layer was thermally crosslinked at 160° C. for 30 minutes, resulting in a ~50 nm layer on top of the dielectric layer.

A polythiophene having the following formula was used as the semiconductor:

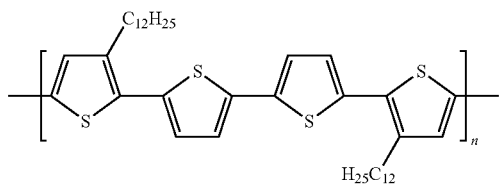

where n is a number of from about 5 to about 5,000. This polythiophene and its preparation are described in Beng Ong et al., US Patent Application Publication No. US 2003/0160230 A1, the disclosure of which is totally incorporated herein by reference. The polythiophene semiconductor layer was deposited on top of the gate dielectric by spin coating at 1000 rpm for 2 minutes. The semiconductor layer was dried and annealed in a vacuum oven at 145° C. for 20 minutes and was about 30 nm thick. Subsequently, a set of gold source/drain electrode pairs were vacuum evaporated on top of the resulting semiconductor layer through a shadow mask to form a series of thin film transistors with various dimensions.

The devices were then characterized using a Keithley 4200 semiconductor characterization system. Using thin film transistors with a channel length of 90 μm and a channel width of 1000 μm, a mobility of 0.07-0.10 cm$^2$/V·sec and current on/off ratio of 10$^4$-10$^5$ were observed. These are the same level as devices using a dielectric layer of silicon oxide.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A thin film transistor comprising a substrate, a gate dielectric layer, and a semiconducting layer, wherein the gate dielectric layer comprises a poly(hydroxyalkyl acrylate-co-acrylonitrile) based polymer of Formula (I):

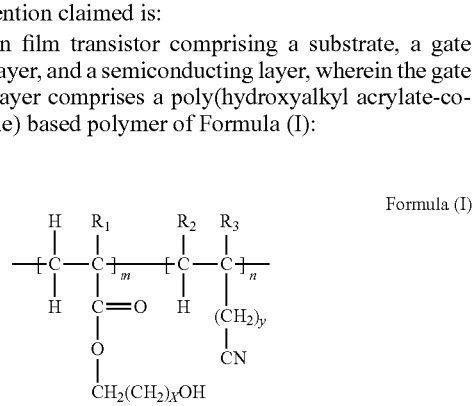

Formula (I)

wherein $R_1$, $R_2$, and $R_3$ are independently selected from alkyl, cyanoalkyl, cyano, and hydrogen; x is from 1 to 5; y is from 0 to 5; m is the number of hydroxyalkyl acrylate monomers, and n is the number of acrylonitrile monomers.

2. The transistor of claim 1, wherein the poly(hydroxyalkyl acrylate-co-acrylonitrile) based polymer has a dielectric constant of from about 3 to about 18.

3. The transistor of claim 1, wherein the poly(hydroxyalkyl acrylate-co-acrylonitrile) based polymer has a dielectric constant of from about 4 to about 10.

4. The transistor of claim 1, wherein the poly(hydroxyalkyl acrylate-co-acrylonitrile) based polymer is crosslinked with a crosslinking agent.

5. The transistor of claim 4, wherein the crosslinking agent is selected from the group consisting of isocyanates, tri(2-aminoethyl)amine, diethylene triamine, melamine-formaldehyde resins, compounds containing at least two epoxy groups, compounds containing at least two carboxylic acid groups, and acid anhydrides of carboxylic acid, and mixtures thereof.

6. The transistor of claim 1, wherein the molar ratio of hydroxyalkyl acrylate to acrylonitrile in the poly(hydroxyalkyl acrylate-co-acrylonitrile) based polymer is from about 9:1 to about 1:9.

7. The transistor of claim 1, wherein the molar ratio of hydroxyalkyl acrylate to acrylonitrile in the poly(hydroxyalkyl acrylate-co-acrylonitrile) based polymer is from about 2:1 to about 1:2.

8. The transistor of claim 1, wherein the poly(hydroxyalkyl acrylate-co-acrylonitrile) based polymer is a poly(hydroxyalkyl acrylate-co-acrylonitrile)copolymer.

9. The transistor of claim 1, wherein the poly(hydroxyalkyl acrylate-co-acrylonitrile) based polymer is poly(2-hydroxyethyl acrylate-co-methacrylonitrile).

10. The transistor of claim 1, wherein the gate dielectric layer further comprises inorganic nanoparticles.

11. The transistor of claim 1, wherein the gate dielectric layer has a thickness of 2 microns or less.

12. The transistor of claim 1, wherein the semiconducting layer comprises a thiophene-based polymer.

13. The transistor of claim 12, wherein the thiophene-based polymer has the structure of formula (1):

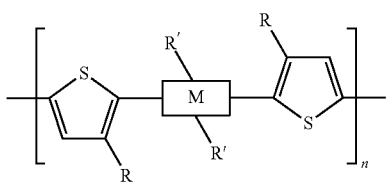

where R and R' are independently selected from hydrogen, halogen, alkyl, alkoxyalkyl, siloxyalkyl, and perfluoroalkyl; M is a divalent linkage; and n is the number of repeat units.

14. The transistor of claim 1, wherein the gate dielectric layer has a capacitance greater than 10 nF/cm$^2$.

15. The transistor of claim 1, wherein the gate dielectric layer has a thickness of from about 100 nanometers to about 1000 nanometers, and a capacitance greater than 10 nF/cm$^2$.

16. A gate dielectric layer for an electronic device, the layer comprising a poly(hydroxyalkyl acrylate-co-acrylonitrile) based polymer.

* * * * *